United States Patent
Takafuji et al.

(10) Patent No.: US 8,995,184 B2
(45) Date of Patent: Mar. 31, 2015

(54) ADAPTIVE OPERATION OF MULTI LEVEL CELL MEMORY

(71) Applicant: SanDisk Technologies Inc., Plano, TX (US)

(72) Inventors: Ryan Chiezo Takafuji, San Jose, CA (US); Nian Niles Yang, Mountain View, CA (US); Chris Nga Yee Avila, Saratoga, CA (US)

(73) Assignee: SanDisk Technologies Inc., Plano, TX (US)

( * ) Notice: Subject to any disclaimer, the term of this patent is extended or adjusted under 35 U.S.C. 154(b) by 144 days.

(21) Appl. No.: 13/741,221

(22) Filed: Jan. 14, 2013

(65) Prior Publication Data

US 2014/0160842 A1      Jun. 12, 2014

Related U.S. Application Data

(60) Provisional application No. 61/734,272, filed on Dec. 6, 2012.

(51) Int. Cl.
| | |
|---|---|
| G11C 16/06 | (2006.01) |
| G11C 11/56 | (2006.01) |
| G11C 16/04 | (2006.01) |
| G11C 16/34 | (2006.01) |

(52) U.S. Cl.
CPC ........ G11C 11/5621 (2013.01); G11C 16/0483 (2013.01); G11C 16/3418 (2013.01); G11C 16/349 (2013.01)
USPC ............ 365/185.03; 365/185.11; 365/185.17; 365/185.33; 365/189.14

(58) Field of Classification Search
CPC .................. G11C 2211/5641; G11C 11/5628; G11C 11/5621; G11C 2211/5621; G11C 16/34
USPC .................... 365/185.03, 185.11, 17, 185.24, 365/185.33, 189.14
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,661,053 A | 8/1997 | Yuan |
| 5,768,192 A | 6/1998 | Eitan |
| 5,903,495 A | 5/1999 | Takeuchi et al. |

(Continued)

FOREIGN PATENT DOCUMENTS

WO         WO 9534074          12/1995

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Thong Q Le

(57) ABSTRACT

A Multi Level Cell (MLC) nonvolatile memory is tested and, if it fails to meet an MLC specification, is reconfigured for operation as an SLC memory by assigning two of the MLC memory cell states as SLC states in a first SLC mode, according to predefined sets of criteria. Subsequently, different MLC memory cell states are assigned as SLC states in a second SLC mode.

20 Claims, 11 Drawing Sheets

(56) References Cited

U.S. PATENT DOCUMENTS

| | | |
|---|---|---|
| 6,011,725 A | 1/2000 | Eitan |
| 6,046,935 A | 4/2000 | Takeuchi et al. |
| 6,222,762 B1 | 4/2001 | Guterman et al. |
| 7,308,525 B2 | 12/2007 | Lasser et al. |
| 7,545,673 B2 | 6/2009 | Lasser |
| 2008/0172520 A1 | 7/2008 | Lee |
| 2008/0209282 A1 | 8/2008 | Lee et al. |
| 2011/0302354 A1 | 12/2011 | Miller |
| 2012/0008390 A1 | 1/2012 | Seong |
| 2012/0155166 A1* | 6/2012 | Li .................. 365/185.03 |
| 2012/0173827 A1 | 7/2012 | Wood et al. |

OTHER PUBLICATIONS

Technical Search Report, Aug. 10, 2012, pp. 1-7.

* cited by examiner

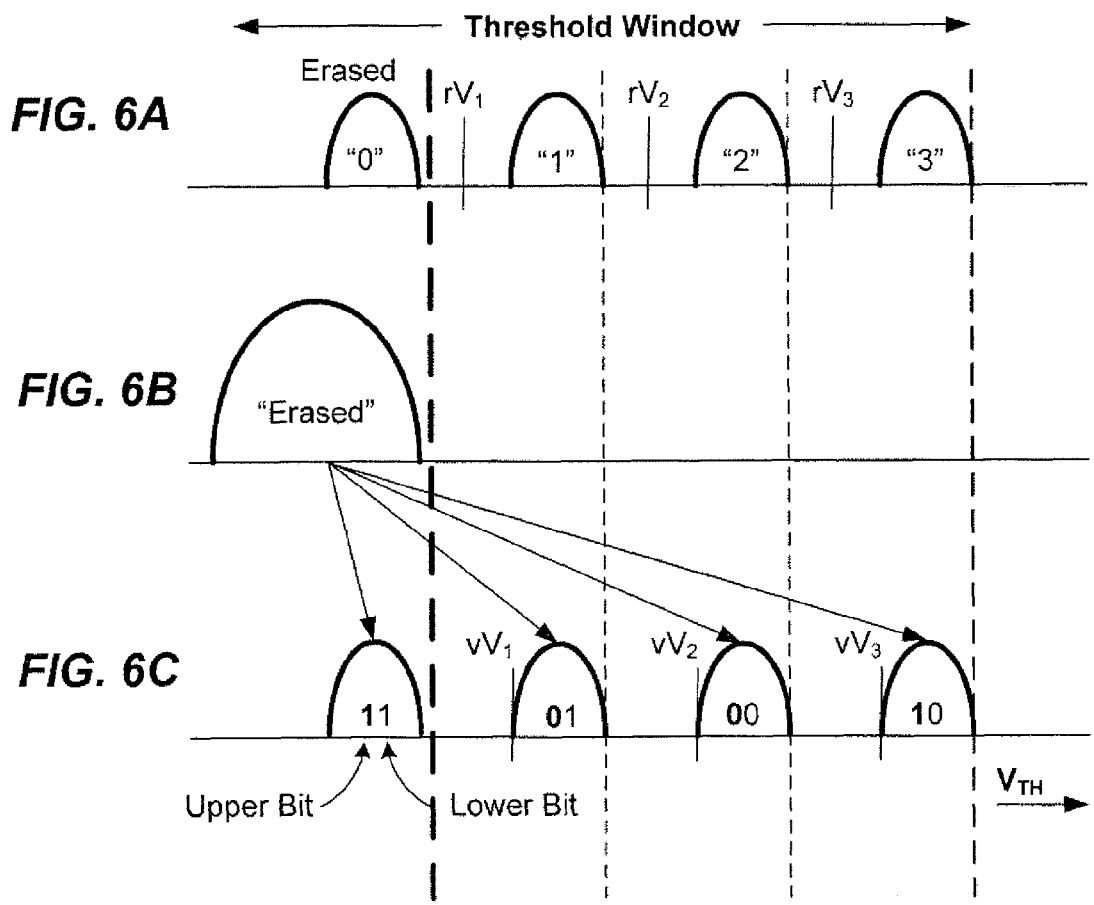
Programming into four states represented by a 2-bit code

Multistate Memory

Lower Page Programming (2-bit Code)

Upper Page Programming (2-bit Code)

Lower Page Read (2-bit Code)

Upper Page Read (2-bit Code)

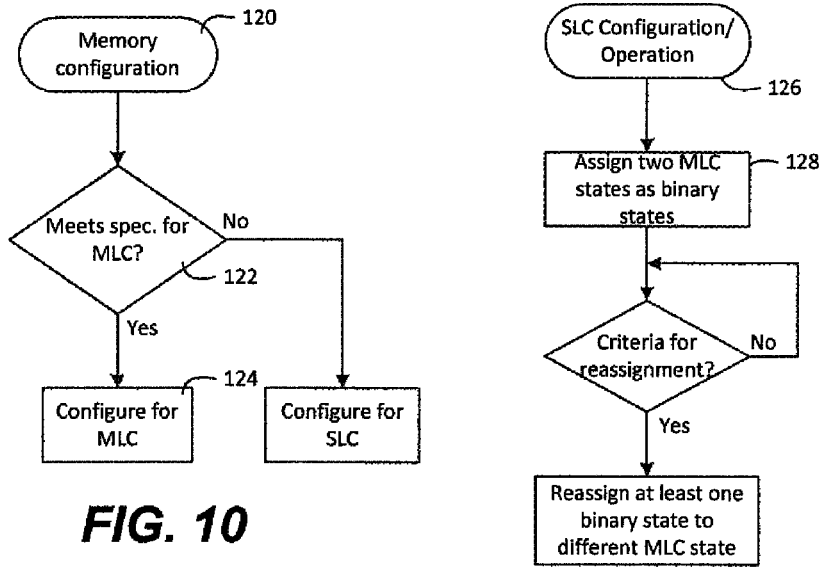
FIG. 10
FIG. 11
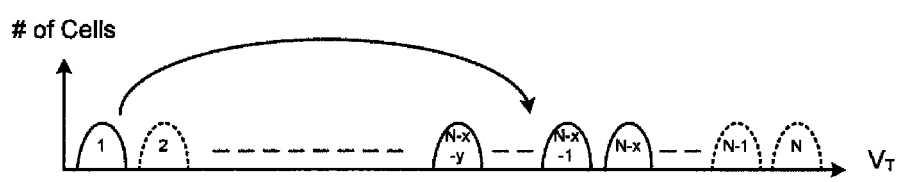
FIG. 12A
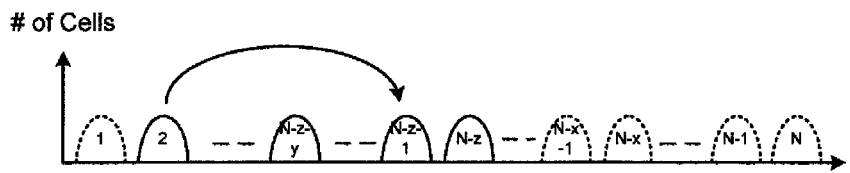
FIG. 12B

ADAPTIVE OPERATION OF MULTI LEVEL CELL MEMORY

This application claims the benefit of U.S. Provisional Patent Application No. 61/734,272, filed on Dec. 6, 2012.

BACKGROUND

This application relates to the operation of re-programmable non-volatile memory systems such as semiconductor flash memory that can store more than one bit per cell by writing multiple states, and more specifically, to using fewer than all such states, and using different states in different modes in an adaptive manner.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage range within the window may, in principle, be used to designate a definite memory state of the cell.

In some memory systems, a memory cell is operated with two threshold voltage ranges representing two different memory states to store one bit per cell. Such memory systems may be referred to as Single Level Cell (SLC) memory systems. In other memory systems, a memory cell is operated with three or more threshold voltage ranges representing three or more different memory states to store more than one bit per cell (e.g. four threshold voltage ranges representing four different memory states to store two bits per cell). Such memory systems may be referred to as Multi Level Cell (MLC) memory systems. In some cases, a memory system, or a portion of a memory system, that is designed for MLC operation may be configured for SLC operation.

When an MLC memory, or a portion of an MLC memory, is reconfigured for SLC operation, it is desirable to provide good data retention and to avoid problems of overprogramming over the lifetime of the memory.

SUMMARY OF THE INVENTION

An MLC memory array may be reconfigured for use as an SLC memory array very simply, by using two of the MLC memory cell states as SLC memory cell states. For example, two of four MLC states may be used and the other two MLC states may not be used in a first mode. The memory may later be reconfigured by reassigning at least one logical state from one of the four MLC states to a different one of the four MLC states. Reassignment may be triggered by various conditions, and may occur just once during the lifecycle of the memory, or may occur two or more times. Reassignment can also be applied to MLC memory arrays capable of being programmed to N memory cell states that are operated with fewer than N states. Initial operation may use a certain subset of N memory cell states and later operation may use a different subset of the N memory cell states.

An example of an adaptable method of operating a plurality of cells of a Multi-Level Cell (MLC) nonvolatile memory array in different binary modes, includes: assigning a first binary state to a first MLC state of three or more MLC states; assigning a second binary state to a second MLC state of the three or more MLC states in a first mode; and subsequently reassigning the second binary state from the second MLC state to a third MLC state of the three or more MLC states in a second mode.

The first MLC state may be an erased state, and the second MLC state may correspond to more charge in a charge storage element of a memory cell than the third MLC state. The second MLC state may correspond to the most charge in a charge storage element of any of the three or more MLC states. The second binary state may subsequently be reassigned from the third MLC state to a fourth MLC state of the three or more MLC states, the third MLC state corresponding to more charge in a charge storage element of a memory cell than the fourth MLC state. The reassigning may be triggered by a number of write-erase cycles of the plurality of memory cells exceeding a predetermined number. The reassigning may be triggered by a number of read operations directed to the plurality of memory cells exceeding a predetermined number. Changing from the first mode to the second mode may be triggered by elapse of a predetermined time. Changing from the first mode to the second mode may be triggered by environmental conditions exceeding predetermined criteria. The environmental conditions may include temperature of the flash memory array and the predetermined criteria may include a predetermined temperature which, when exceeded for a predetermined period of time, triggers the reassignment. Changing from the first mode to the second mode may be triggered by Error Correction Coding (ECC) statistics indicating that the plurality of memory cells have reduced data retention capability. The plurality of cells may consist of all cells in a memory die. The plurality of cells may consist of all cells in an erase block, the flash memory array containing other cells which continue to operate in the first mode while the plurality of cells operate in the second mode.

An example of a nonvolatile memory array includes: a plurality of nonvolatile memory cells having three or more threshold voltage ranges individually assigned to represent logic states; and programming circuits that in a first programming mode program the plurality of cells to a first two of the three or more threshold voltage ranges and that in a second programming mode program the plurality of cells to a second two of the three or more threshold voltage ranges, the second two including at least one threshold voltage range that is not included in the first two.

The nonvolatile memory array may include a mode change circuit that triggers a change in the programming circuits from the first programming mode to the second programming mode in response to one or more predetermined criteria. The nonvolatile memory array may include read circuits that read data programmed by the programming circuit in the first programming mode and the second programming mode. The read circuits may distinguish between cells programmed to the first two of the three or more threshold voltage ranges using a discrimination voltage and distinguish between cells programmed to the second two of the three or more threshold voltage ranges using the same discrimination voltage.

An example of an adaptable method of configuring a plurality of cells of a Multi-Level Cell (MLC) nonvolatile memory array includes: determining if the plurality of cells meet a first set of metrics for operation of MLC nonvolatile memory; if the plurality of cells meet the first set of metrics, then configuring the plurality of cells to store more than one bit per cell using three or more predetermined threshold voltage ranges; if the plurality of cells do not meet the first set of metrics, then configuring the plurality of cells to store one bit per cell using a first two of the three or more predetermined threshold voltage ranges; and subsequently reconfiguring the plurality of cells to store one bit per cell using a second two of the three or more predetermined threshold voltage ranges.

Configuring the plurality of cells to store one bit per cell may include setting a bit that indicates that the plurality of cells are to store one bit per cell and subsequent access to the plurality of cells may include reading the bit to determine whether the plurality of cells store one bit per cell, or more than one bit per cell.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6C illustrate an example of programming 4-state memory cells.

FIG. 10 shows a process for memory configuration applied to MLC memory.

FIG. 11 shows a process for configuration/operation of an MLC memory in SLC mode.

FIG. 12A-B show an N-state memory reconfigured to use a subset of N states.

DETAILED DESCRIPTION

Memory System

Figure 1:
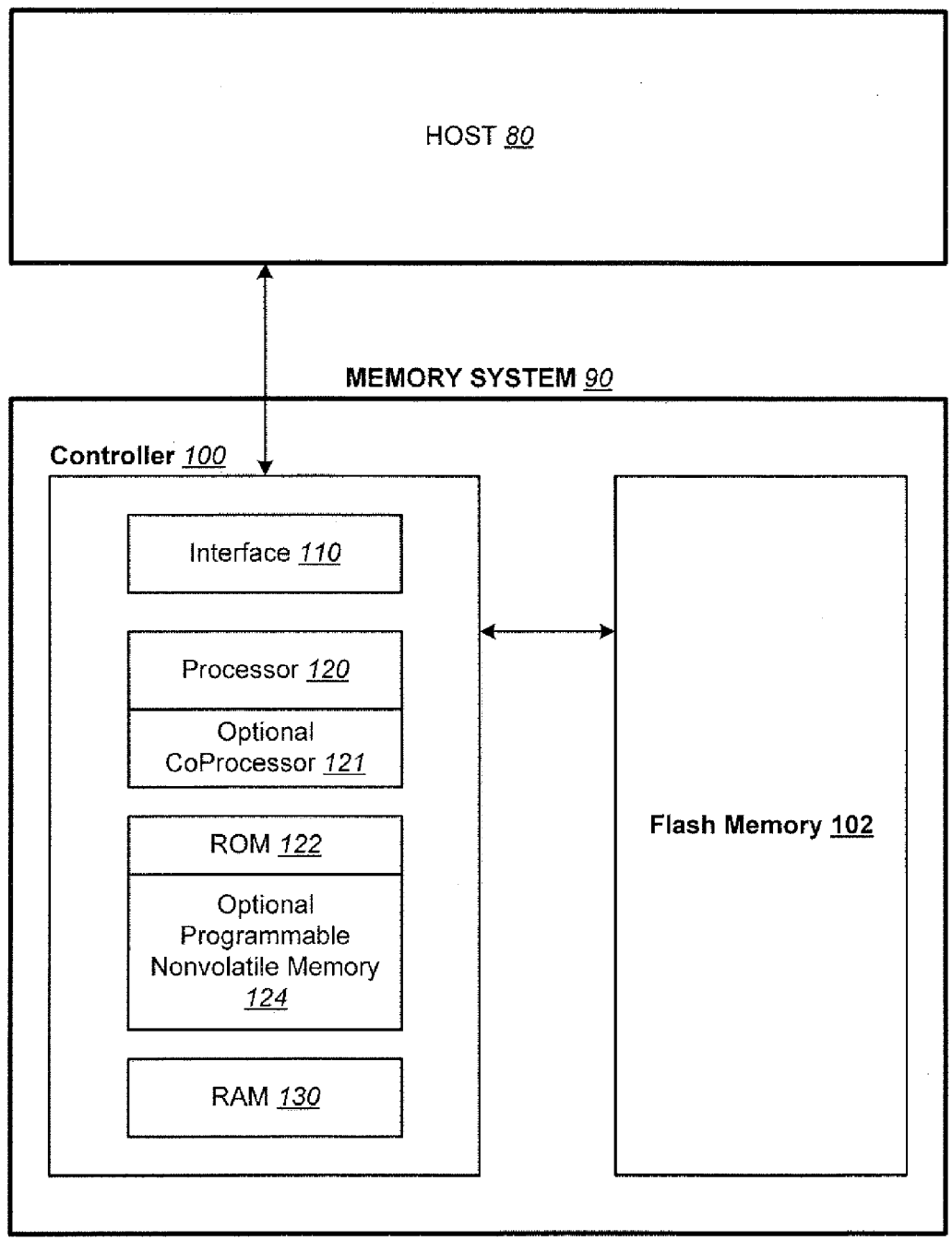
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a flash memory 102 whose operations are controlled by a controller 100. Flash memory 102 comprises one or more array of non-volatile memory cells distributed over one or more integrated circuit chip. Controller 100 includes interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

Physical Memory Structure

Figure 2:
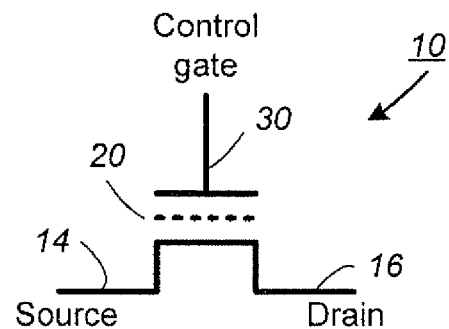
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
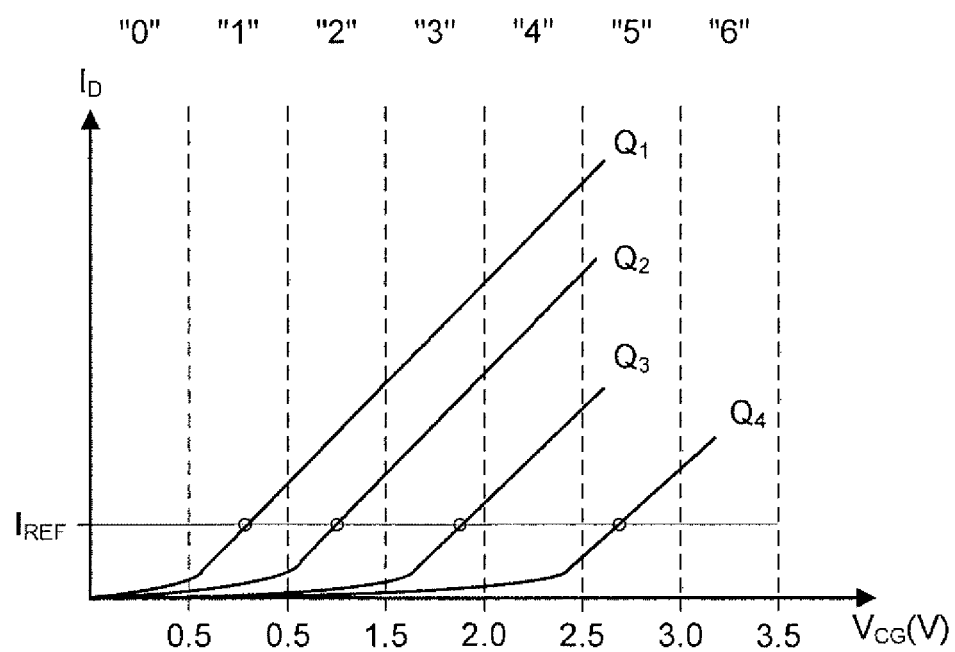
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into different regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Figure 4A:
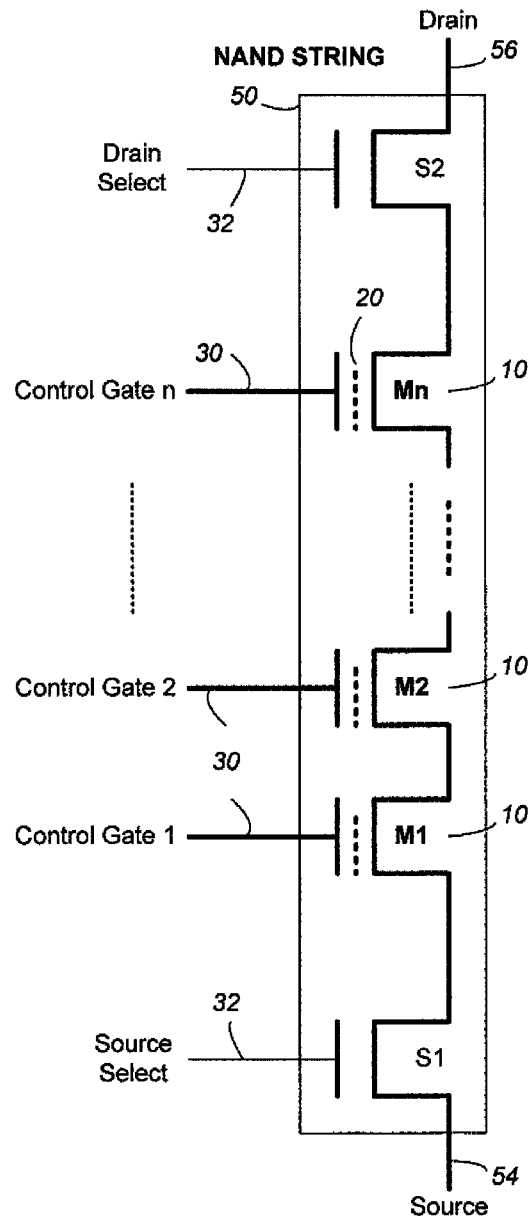
FIG. 4A illustrates schematically a string of memory cells organized into a NAND string.

FIG. 4A illustrates schematically a string of memory cells organized into a NAND string. A NAND string 50 comprises of a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
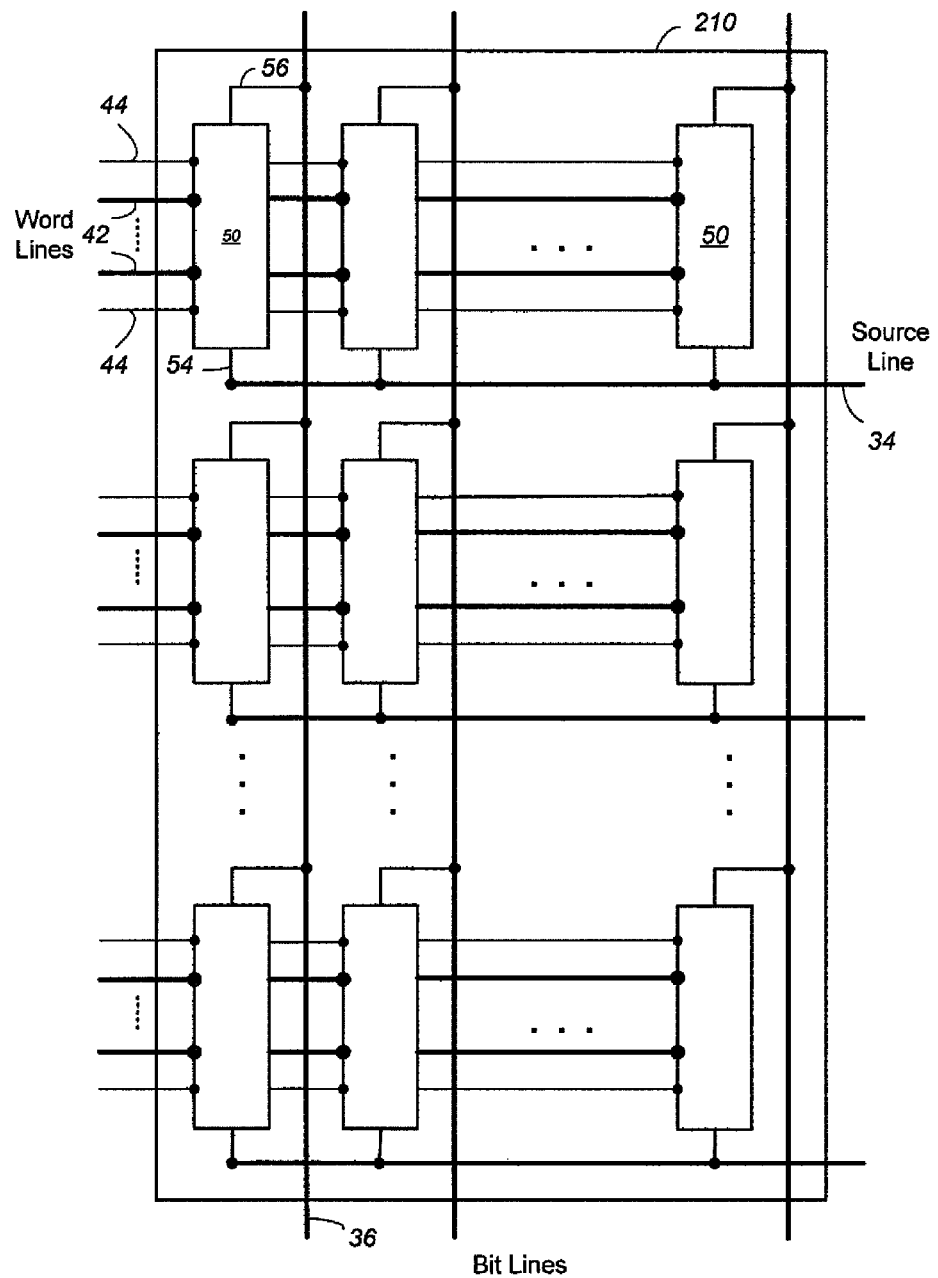
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
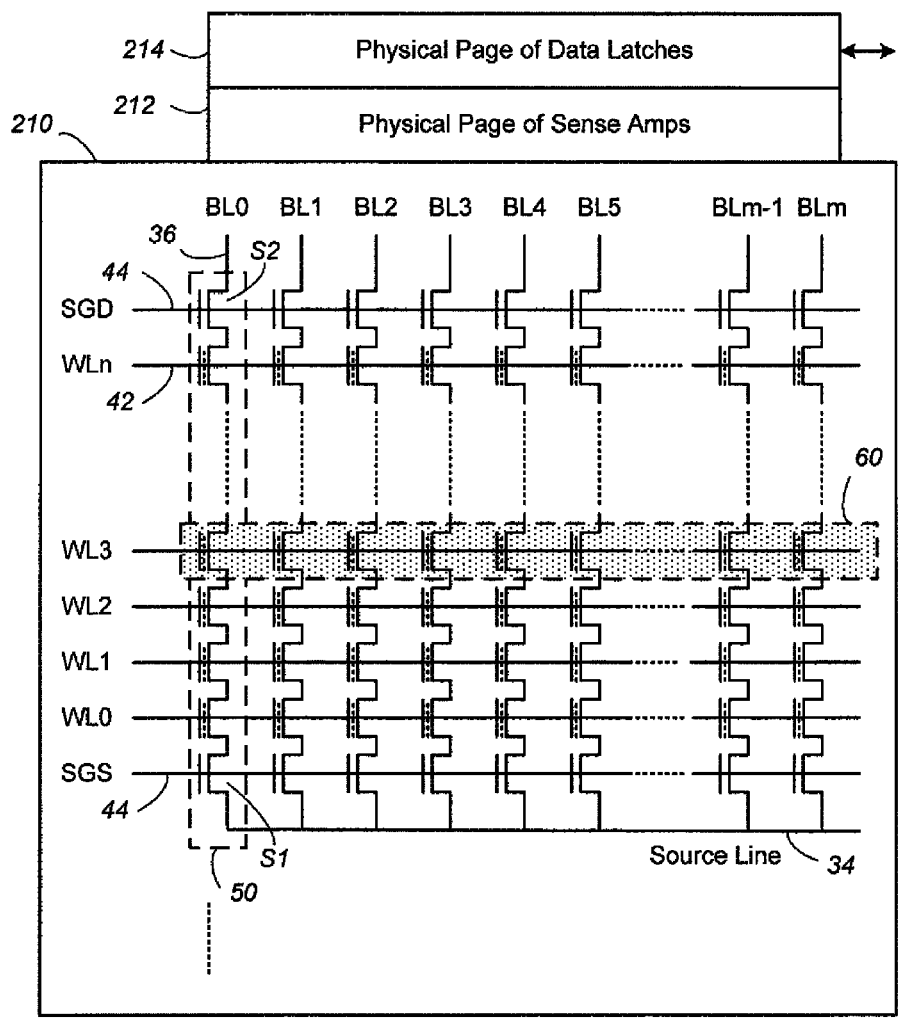
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 411, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that update data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

FIGS. 6A-6C illustrate an example of programming a population of 4-state memory cells. FIG. 6A illustrates the population of memory cells programmable into four distinct distributions of threshold voltages respectively representing memory states "0", "1", "2" and "3". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

Bit-by-Bit MLC Programming and Reading

Figure 7A:
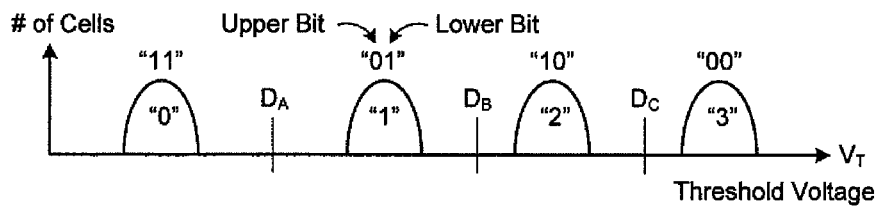
FIGS. 7A-7E illustrates an example of the programming and reading of the 4-state memory encoded with a given 2-bit code.

FIGS. 7A-7E illustrate the programming and reading of the 4-state memory encoded with a given 2-bit code. FIG. 7A illustrates threshold voltage distributions of the 4-state memory array when each memory cell stores two bits of data using the 2-bit code. Such a 2-bit code has been disclosed in U.S. Pat. No. 7,057,939.

Figure 7B:
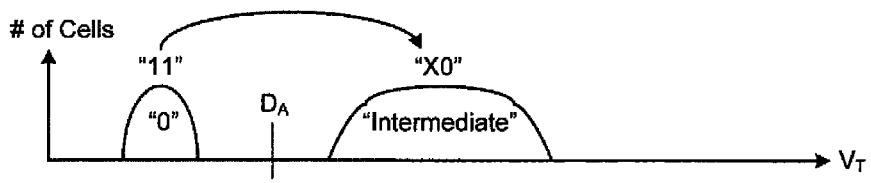

FIG. 7B illustrates the lower page programming (lower bit) in a 2-pass programming scheme using the 2-bit code. The fault-tolerant LM New code essentially avoids any upper page programming to transit through any intermediate states. Thus, the first pass lower page programming has the logical state (upper bit, lower bit)=(1, 1) transits to some intermediate state (x, 0) as represented by programming the "unprogrammed" memory state "0" to the "intermediate" state designated by (x, 0) with a programmed threshold voltage greater than $D_A$ but less than $D_C$.

Figure 7C:
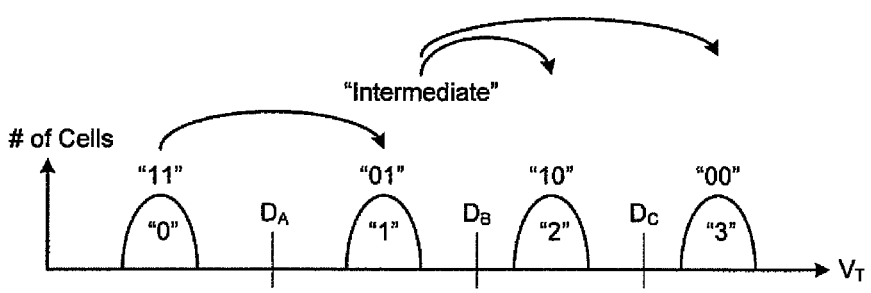
Figure 7D:
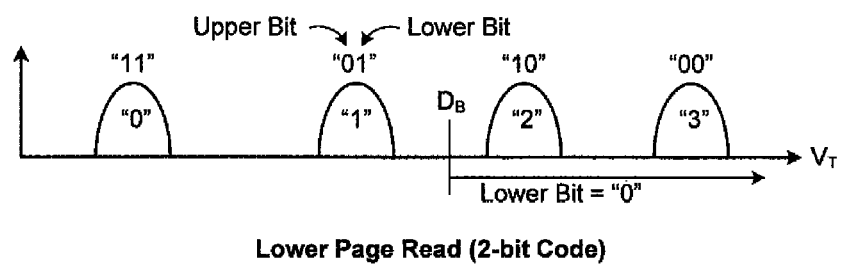

FIG. 7C illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "0" to "1". If the lower page bit is at "0", the logical state (0, 0) is obtained by programming from the "intermediate" state to "3". Similarly, if the upper page is to remain at "1", while the lower page has been programmed to "0", it will require a transition from the "intermediate" state to (1, 0) as represented by programming the "intermediate" state to FIG. 7D illustrates the read operation that is required to discern the lower bit of the 4-state memory encoded with the 2-bit code. If the upper page has been programmed and then a readB operation will yield the lower page data correctly. On the other hand, if the upper page has not yet been programmed, the lower page data should be read by a readA operation.

Figure 7E:
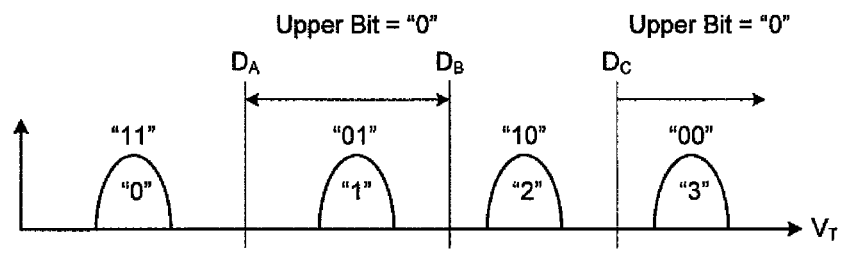

FIG. 7E illustrates the read operation that is required to discern the upper bit of the 4-state memory encoded with the 2-bit code. As is clear from the figure, the upper page read will require a 3-pass read of readA, readB and readC, respectively relative to the demarcation threshold voltages $D_A$, $D_B$ and $D_C$.

In the bit-by-bit scheme for a 2-bit memory, a physical page of memory cells will store two logical data pages, a lower data page corresponding to the lower bit and an upper data page corresponding to the upper bit. In other examples, additional pages of data may be stored by storing more than two bits per cell in a physical page. For example, three pages of data may be stored by storing three bits per cell in a physical page.

SLC Operation of MLC Memory

In some examples, memory systems are designed and manufactured to be used as MLC memory systems but at least some (in some cases all) of their memory cells are operated in SLC mode. While such operation results in lower storage density (fewer bits of data in a given area of the memory array) it may have other benefits (faster programming and reading, less chance of disturbance, better data retention, etc.). Some memories operate with many blocks of MLC memory and a few blocks of SLC memory that operate as a binary cache. In general, such blocks are physically identical and are simply operated differently.

In some cases, an MLC memory array may be tested during manufacturing to determine if it meets certain metrics. For example, an industry standard or customer specification may require memory arrays to meet certain metrics with respect to write speed, read speed, latency, data retention time, number of bad blocks, etc. In some cases, an MLC memory array that fails to meet such metrics may be reconfigured partially, or entirely, for SLC operation. While a memory system containing such a reconfigured memory array may not meet the metrics for which it was designed, and may therefore be unsalable for its original purpose, it may still meet some less demanding set of metrics thus making it salable for some other purpose (though generally at a lower price).

One way to reconfigure an MLC memory for SLC operation is to use two states as shown in FIG. 7B, with the programmed state (lower page "0" state in FIG. 7B) having a relatively large distribution that is quick to program. The erased state (lower page "1" of FIG. 7B) may be the same as the MLC erased state, or may be different. Another way to reconfigure MLC memory for SLC operation is to select two of the MLC states and assign them as SLC states. The MLC erased state may be used as one of the SLC states and one of the programmed MLC states may be used as the other SLC state.

Figure 8A:
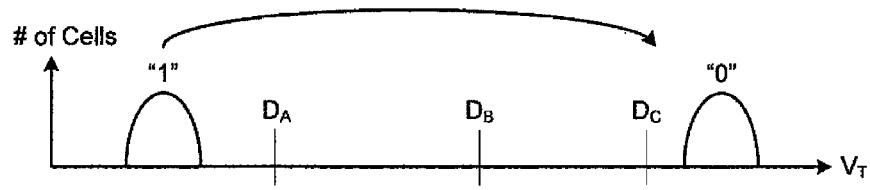
FIG. 8A-8B illustrate programming MLC cells for SLC operation using MLC states.

An example of a memory array in which SLC states are assigned to two of four MLC states is shown in FIG. 8A. FIG. 8A corresponds to the four-state memory array shown previously in FIGS. 7A-7E, but in FIG. 8A the memory array is operated in SLC mode using two MLC memory states. In particular, the erased state that was assigned as the "11" state for MLC operation is assigned as the "1" state for SLC operation. The highest state that was assigned as the "00" state in MLC operation is assigned as the "0" state in SLC operation. Thus, while four different threshold voltage ranges are assigned to four different memory states for MLC operation, just two of these threshold voltage ranges are assigned to two different memory states for SLC operation.

One advantage of using MLC states when operating an MLC array as an SLC array is that the MLC programming and reading schemes may be used. This means that reconfiguration does not have to be as extensive as it would if completely different threshold voltage ranges were used. By choosing two states with the greatest separation (as in FIG. 8A) the chances of misreading memory cells is reduced. Such a separation tends to give long data retention times because the charge leakage needed to shift the "0" state sufficiently to cause a significant number of misreads would generally take a long time. Any of the voltages $D_A$, $D_B$, or $D_C$ may be used as a read voltage to discriminate between cells in the "1" and "0" states in FIG. 8A.

While certain examples here refer to reconfiguring memory arrays, it will be understood that reassignment may be performed for an entire device, or just a portion of a device (some number of blocks for example). The present invention is not limited to any particular unit.

One problem that may occur when SLC states are assigned as shown in FIG. 8A is that after significant use, overprogramming of memory cells may become problematic. In particular, after a significant number of write-erase cycles using such a scheme (programming to the highest state) significant wear affects memory cells and increases the possibility of overprogramming.

Figure 8B:
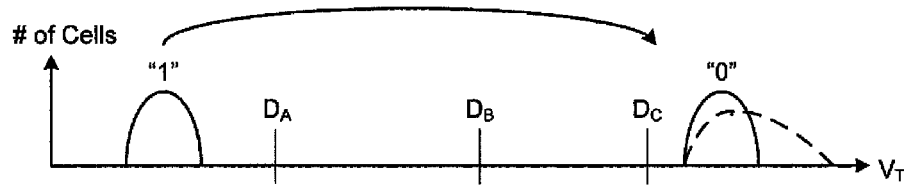

FIG. 8B shows an example of how overprogramming may affect threshold voltage. In FIG. 8B, the initial "0" state (when the device is new) is shown by a solid line, while the "0" state after significant use is shown by the dashed line. Overprogrammed cells have a higher threshold voltage than correctly programmed cells. Such overprogrammed cells may have such a high threshold voltage that they do not turn on when they are expected to turn on. For example, reading a row of memory cells in a NAND flash memory array generally requires turning on all memory cells in rows on either side of the row to be read. Memory cells in neighboring rows are expected to turn on (channel becomes conductive), regardless of their programmed state, when a pass voltage is applied. If such neighboring cells remain off then the NAND string will not be conductive and the cell in question cannot be read (it will appear to be in a programmed "0" state even if it is in the erased "1") state. Thus, overprogramming of one cell can cause a whole NAND string to fail.

Reconfiguration Between SLC Modes

According to an example, an MLC memory array that is reconfigured for use as an SLC memory array, by assigning certain MLC states as SLC states, is subsequently reconfigured to use different MLC states as the SLC states. For example, where testing shows that an MLC memory does not meet a certain set of metrics, the MLC memory may be reconfigured as an SLC memory that uses certain MLC states. This may be done at the factory or during initialization. Later, after some use, the memory may be reconfigured so that different MLC states are used. Such reconfiguration may occur more than once during the lifecycle of the device. Such reconfiguration may be triggered by several different triggering events, or may be triggered according to a triggering algorithm that considers two or more different factors to determine when such reconfiguration should be performed.

Figure 9A:
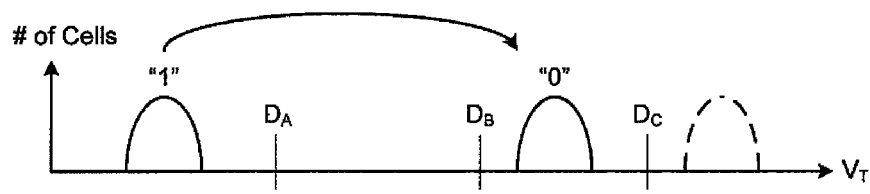
FIG. 9A-9B show reassignment of SLC states from initial MLC states to different states.

FIG. 9A shows an example of a group of MLC memory cells that are operated in SLC mode, where initially SLC states are assigned to the erased state and the highest state (shown by dashed line), and are later reconfigured so that the SLC states are assigned to the erased state and the next highest state (shown by solid line). Such reconfiguration may avoid problems of overprogramming as described above. Even if overprogramming occurs using the memory state shown, it is unlikely that overprogramming is so bad that cells fail to turn on when pass voltage is applied (which would require programming to a threshold voltage above the highest state). Thus, this assignment scheme is more tolerant of overprogramming than the original scheme and in this way is more suited to worn memory cells.

Figure 9B:
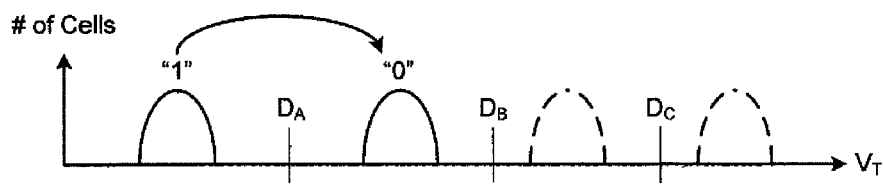

FIG. 9B shows the group of memory cells after a second reconfiguration, following the reconfiguration of FIG. 9A. The SLC states used in this assignment scheme are the two lowest states. Thus, the risk of overprogramming is even lower than in FIG. 9A. Such a second reconfiguration may take place sometime after the first reconfiguration. A second or subsequent reconfiguration may be triggered by various conditions or a combination of conditions.

It will be understood that the reconfigurations described above result in assignment schemes that are all readable using the same read voltage or voltages. For example, where an initial assignment scheme assigns the programmed SLC state to the highest MLC state (as in FIG. 8A), such cells may be read using $D_A$. Where cells are later reconfigured so that the programmed SLC state is assigned to the next highest MLC state (as in FIG. 9A), these cells may also be read using $D_A$. Where cells are later reconfigured so that the programmed SLC state is assigned to the lowest programmed MLC state (as in FIG. 9B), these cells may also be read using $D_A$. Thus, by choosing an appropriate read voltage, reading may be performed in the same manner for both reconfigured cells and unreconfigured cells.

In one example, a reconfiguration (first or subsequent) may be triggered by a "hot count" that exceeds a predetermined number. "Hot count" is an indication of the number of write-erase cycles that a block has endured. Typically, a block has a predictable lifetime in terms of hot count (e.g. cells may have a mean of 100,000 write-erase cycles before failure). In one example, reconfiguration occurs just once when hot count indicates that it is half-way to failure.

In another example, reconfiguration may be triggered based on time rather than hot count. For example, a memory system may keep track of total time since initialization, or active time since initialization (time with power on), or some other time. After a predetermined period of time, the MLC memory may be reconfigured so that different MLC states are used as SLC states.

In another example, reconfiguration may be triggered as a result of Error Correction Code (ECC). In most memory systems, ECC is used to detect and correct errors in data that is read from the memory. The number of errors, and changes in the average number of errors over time, may give an indication of how worn or damaged the memory (or a portion of the memory) has become. For example, a block may initially have an average of two or three errors per page, but later have an average of six or seven bits per page. In some cases, the severity of errors indicated by ECC may provide a trigger for reconfiguration. For example, when the average number of errors per page exceeds a predetermined number, the memory array (or a block, or a number of blocks) may be reconfigured.

In another example, temperature during memory cell programming may trigger reconfiguration. Many memory systems have at least one temperature sensor so that the temperature of the memory die is known. In one example, when the temperature exceeds a predetermined temperature, the highest MLC state is used. When the temperature is below the predetermined temperature a lower MLC state is used. Thus, the memory may be reconfigured from one mode to the other and back again. Such reconfiguration may occur relatively frequently depending on the temperatures in which the memory system is used.

In another example, a read count is used to trigger reconfiguration. Reading memory cells may cause wear that changes the characteristics of the cells. Thus, even though a group of memory cells may not have a very high hot count, the memory cells may be significantly degraded when they are frequently read. Reassigning the SLC states to different ones of the MLC states may be triggered by a read count exceeding a predetermined number, or by a combination of read count and other factors (such as hot count).

In another example, a reconfiguration is triggered by an external command. For example, a host device may determine that a reconfiguration is appropriate and may issue a command to the memory system to perform a reconfiguration. The host device may make the determination based on the quality of data returned from the memory system (e.g. host may apply its own ECC or other indicator of data quality). Alternatively, the host may make the determination based on one or more other factors including environmental factors such as temperature (e.g. where temperature is separately monitored by the host system and may or may not be monitored by the memory system).

While reconfiguration may be triggered by any one of the above conditions alone, reconfiguration may also be triggered by a combination of conditions according to an appropriate triggering scheme. For example, some combination of time, hot count, and temperature may trigger a reconfiguration.

While the above examples refer to reconfiguration in which the programmed SLC state is reassigned from a higher threshold voltage range down to a lower threshold voltage range, this is not always the case. The programmed SLC state may initially be assigned to a lower threshold voltage range and may then be reassigned up to a higher threshold voltage range. Subsequent reassignment may be up or down and does not have to proceed in the same direction as the first reassignment. Reassignment of the "1" state may also be performed so that either of the SLC states may move in either direction (up or down in threshold voltage) in a reconfiguration.

FIG. 10 shows how memory configuration may be performed as part of a factory testing and configuring process. A particular memory die may be tested to see if it meets a specification for MLC operation. If the die meets the specification then the die is configured for MLC operation. Configured in this way, the memory cells will store more than one bit each by using three or more memory states per cell. If the die does not meet the specification for MLC operation it is instead configured for SLC operation. In this mode, every cell has two SLC states and thus every cell stores one bit of data.

FIG. 11 shows the configuration and operation of a memory die that is configured for SLC operation. Initially, two MLC states are assigned as SLC (binary) states. Subsequently, a determination is made as to whether certain criteria for reassigning the SLC states are met. If the reassignment criteria are not met, then the determination is repeated. If the criteria are met then at least one of the two binary states are reassigned to a different MLC state.

MLC Operation Using Subset of Available States

While the above examples deal with the case of reassignment of two SLC states between four MLC states, aspects of the present invention may be applied to memory systems having any number of MLC states, and to use of any given subset of such MLC states.

FIG. 12A shows a generalized initial configuration where an MLC memory with some number of states N is configured for operation using fewer than N states. For example, the memory could have 16 memory states (N=16) but be configured to use just 8 of them. Memory cells are not programmed to states N, N−1 as indicated by the dotted lines. Instead, the highest of the N states that is used is N−x. States N−x, N−x−1 . . . N−x−y, are used (in addition to state 1) so that a total of y+1 states of N available states are used. The states N−x−y to N−x are shown as being sequential although this may not always be the case (e.g. alternate states could be used).

FIG. 12B shows a subsequent configuration where the y+1 states have been reassigned to different threshold voltage ranges. Instead of using state 1, state 2 is now used as the lowest state. States N−x, N−x−1 are no longer used. Instead, the highest state used is N−z. N−z may or may not be one of the previously used states (i.e. may fall within N−x−y to N−x). States N−z, N−z−1 . . . N−z−y are used (in addition to state 2) for storage of y+1 states after reconfiguration.

Figure 13:
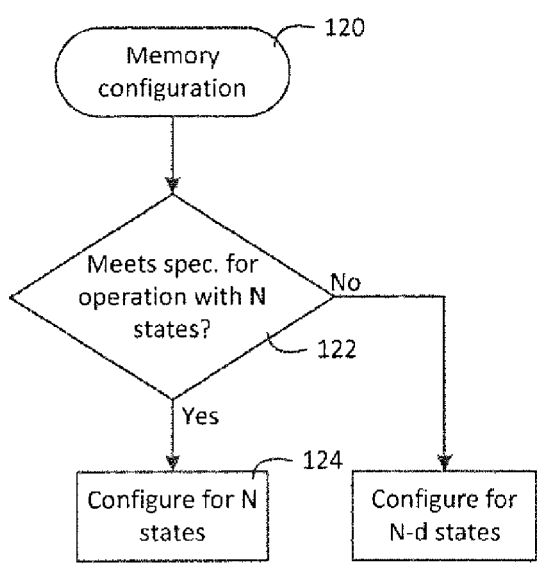
FIG. 13 shows a process for configuration of an N-state memory.

FIG. 13 shows a memory configuration process for a memory that has N memory cell states. A determination is made as to whether the memory meets a specification for operation with N states. If the memory meets the specification then the memory is configured for operation using all of the N states. However, if the memory does not meet the specification then the memory is configured for operation using some smaller number of states (N-d states).

Figure 14:
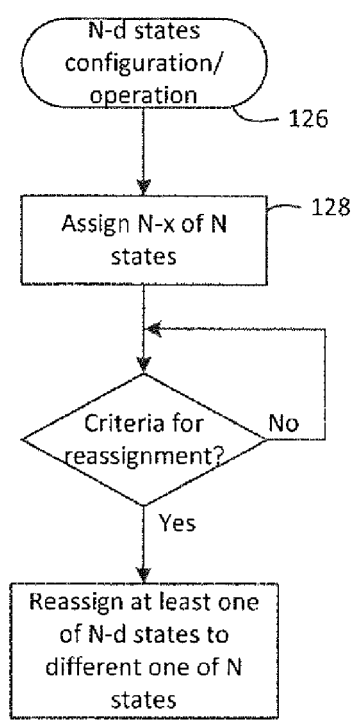
FIG. 14 shows a process for operation of an N-state memory using N-d of the N states.

FIG. 14 shows a memory configuration/operation process for an N-state memory that is configured for operation using N-d states. Initially, N-d states of the available N states are assigned to logic states to store a reduced number of bits. Next, a determination is made as to whether certain criteria for reassignment are met. If the criteria for reassignment are not met, then the memory array remains in its current configuration and the determination may be repeated. If the criteria for reassignment are met then at least one of the N-d states is reassigned to a different one of the N available states.

Conclusion

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. An adaptable method of operating a plurality of cells of a Multi-Level Cell (MLC) nonvolatile memory array in different binary modes, comprising:
    assigning a first binary state to a first MLC state of three or more MLC states;
    assigning a second binary state to a second MLC state of the three or more MLC states in a first mode; and
    subsequently reassigning the second binary state from the second MLC state to a third MLC state of the three or more MLC states in a second mode.

2. The adaptable method of claim 1 wherein the first MLC state is an erased state, and the second MLC state corresponds to more charge in a charge storage element of a memory cell than the third MLC state.

3. The adaptable method of claim 2 wherein the second MLC state corresponds to the most charge in a charge storage element of any of the three or more MLC states.

4. The adaptable method of claim 1 further comprising subsequently reassigning the second binary state from the third MLC state to a fourth MLC state of the three or more MLC states, the third MLC state corresponding to more charge in a charge storage element of a memory cell than the fourth MLC state.

5. The adaptable method of claim 1 wherein the reassigning is triggered by a number of write-erase cycles of the plurality of memory cells exceeding a predetermined number.

6. The adaptable method of claim 1 wherein the reassigning is triggered by a number of read operations directed to the plurality of memory cells exceeding a predetermined number.

7. The adaptable method of claim 1 wherein changing from the first mode to the second mode is triggered by elapse of a predetermined time.

8. The adaptable method of claim 1 wherein changing from the first mode to the second mode is triggered by environmental conditions exceeding predetermined criteria.

9. The adaptable method of claim 8 wherein the environmental conditions include temperature of the flash memory array and the predetermined criteria include a predetermined temperature which, when exceeded for a predetermined period of time, triggers the reassignment.

10. The adaptable method of claim 1 wherein changing from the first mode to the second mode is triggered by Error Correction Coding (ECC) statistics indicating that the plurality of memory cells have reduced data retention capability.

11. The adaptable method of claim 1 wherein the plurality of cells consists of all cells in a memory die.

12. The adaptable method of claim 1 wherein the plurality of cells consists of all cells in an erase block, the flash memory array containing other cells which continue to operate in the first mode while the plurality of cells operate in the second mode.

13. A nonvolatile memory array comprising:
a plurality of nonvolatile memory cells having three or more threshold voltage ranges individually assigned to represent logic states;
programming circuits that in a first programming mode program the plurality of cells to a first two of the three or more threshold voltage ranges and that in a second programming mode program the plurality of cells to a second two of the three or more threshold voltage ranges, the second two including at least one threshold voltage range that is not included in the first two; and
a mode change circuit that triggers a change in the programming circuits from the first programming mode to the second programming mode in response to one or more predetermined criteria.

14. The nonvolatile memory array of claim 13 further comprising read circuits that read data programmed by the programming circuit in the first programming mode and the second programming mode.

15. The nonvolatile memory array of claim 14 wherein the read circuits distinguish between cells programmed to the first two of the three or more threshold voltage ranges using a discrimination voltage and distinguish between cells programmed to the second two of the three or more threshold voltage ranges using the same discrimination voltage.

16. The adaptable method of claim 1 wherein the reassigning is triggered by:
a number of write-erase cycles of the plurality of memory cells exceeding a predetermined number;
a number of read operations directed to the plurality of memory cells exceeding a predetermined number;
elapse of a predetermined time;
environmental conditions exceeding predetermined criteria; or
Error Correction Coding (ECC) statistics indicating that the plurality of memory cells have reduced data retention capability.

17. An adaptable method of configuring a plurality of cells of a Multi-Level Cell (MLC) nonvolatile memory array comprising:
determining if the plurality of cells meet a first set of metrics for operation of MLC nonvolatile memory;
if the plurality of cells meet the first set of metrics, then configuring the plurality of cells to store more than one bit per cell using three or more predetermined threshold voltage ranges;
if the plurality of cells do not meet the first set of metrics, then configuring the plurality of cells to store one bit per cell using a first two of the three or more predetermined threshold voltage ranges; and
subsequently reconfiguring the plurality of cells to store one bit per cell using a second two of the three or more predetermined threshold voltage ranges.

18. The method of claim 17 wherein the configuring the plurality of cells to store one bit per cell includes setting a bit that indicates that the plurality of cells are to store one bit per cell and wherein subsequent access to the plurality of cells includes reading the bit to determine whether the plurality of cells store one bit per cell, or more than one bit per cell.

19. An adaptable method of operating a plurality of cells of an N state per cell Multi-Level Cell (MLC) nonvolatile memory array in different modes that use fewer than N states per cell, comprising:
configuring the N state per cell MLC nonvolatile memory for operation using fewer than N states by assigning M of the N cell states to represent M logical states, leaving M-N of the N cell states unassigned, where M is less than N, in a first operating mode; and
subsequently reassigning at least one of the M logical states to one of the previously unassigned M-N cell states.

20. The adaptable method of claim 19 wherein the reassigning is triggered by:
a number of write-erase cycles of the plurality of memory cells exceeding a predetermined number;
a number of read operations directed to the plurality of memory cells exceeding a predetermined number;
elapse of a predetermined time;
environmental conditions exceeding predetermined criteria; or
Error Correction Coding (ECC) statistics indicating that the plurality of memory cells have reduced data retention capability.

* * * * *